(12) United States Patent
Parichehreh et al.

(10) Patent No.: US 11,506,982 B2
(45) Date of Patent: Nov. 22, 2022

(54) PRISM-MASK FOR ANGLED PATTERNING APPLICATIONS

(71) Applicant: Intel Corporation, Santa Clara, CA (US)

(72) Inventors: Vahidreza Parichehreh, Gilbert, AZ (US); Keith J. Martin, Hillsboro, OR (US); Changhua Liu, Chandler, AZ (US); Leonel Arana, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 911 days.

(21) Appl. No.: 16/143,206

(22) Filed: Sep. 26, 2018

(65) Prior Publication Data

US 2020/0096873 A1 Mar. 26, 2020

(51) Int. Cl.
*G03F 7/20* (2006.01)
*H01L 21/027* (2006.01)
*G02B 5/04* (2006.01)
*H01L 21/3213* (2006.01)

(52) U.S. Cl.
CPC ............ *G03F 7/7035* (2013.01); *G02B 5/04* (2013.01); *G03F 7/70191* (2013.01); *G03F 7/70283* (2013.01); *H01L 21/0274* (2013.01); *H01L 21/0272* (2013.01); *H01L 21/32139* (2013.01)

(58) Field of Classification Search
CPC ............... G03F 7/7035; G03F 7/70191; G03F 7/70283; G03F 1/50; G02B 5/04; H01L 21/0274; H01L 21/0272; H01L 21/32139; H01L 24/13; H01L 24/16; H01L 24/48; H01L 2223/54426; H01L 2224/16227; H01L 2224/48227; H01L 2924/15311; H01L 23/544
See application file for complete search history.

(56) References Cited

U.S. PATENT DOCUMENTS

2010/0208226 A1\* 8/2010 Kim .................... G03F 7/70408
355/72
2013/0057842 A1\* 3/2013 Rock .......................... G03F 1/50
355/67

\* cited by examiner

*Primary Examiner* — Mesfin T Asfaw
(74) *Attorney, Agent, or Firm* — Schwabe, Williamson & Wyatt P.C.

(57) ABSTRACT

Embodiments disclosed herein include a lithographic patterning system and methods of using such a system to form a microelectronic device. The lithographic patterning system includes an actinic radiation source, a stage having a surface for supporting a substrate with a resist layer, and a prism with a first surface over the stage, where the first surface has a masked layer and is substantially parallel to the surface of the stage. The prism may have a second surface that is substantially parallel to the first surface. The first and second surfaces are flat surfaces. The prism is a monolithic prism-mask, where an optical path passes through the system and exits the first surface of the prism through the mask layer. The system may include a layer disposed between the mask and resist layers. The mask layer of the prism may pattern the resist layer without an isolated mask layer.

21 Claims, 5 Drawing Sheets

PRISM-MASK FOR ANGLED PATTERNING APPLICATIONS

FIELD

Embodiments relate to packaging semiconductor devices. More particularly, the embodiments relate to methods and systems for lithographic patterning of semiconductor devices in a direction that is non-perpendicular to a surface of a substrate.

BACKGROUND

Traditional photolithography assumes a vertical projection of the actinic radiation used to expose a resist layer. As such, the exposure image field is projected into the resist vertically and the resulting features patterned into the resist layer will stand substantially perpendicular to the surface of the resist layer. Semiconductor devices (e.g., transistor devices, packaging layers, micro-electromechanical systems (MEMS), and the like) designed or fabricated with such vertical projection lithography will have horizontal lines and perpendicular vias.

Patterned lines and vias in traditional photolithography, including projection and contact exposure tools, are substantially perpendicular to the substrate as respectively the lithographic exposure light has to be substantially perpendicular to project onto the resist vertically. Recent requirements in the industry to form angled patterning are rising, especially when testing silicon dies. Existing solutions may use a prism on top of the lithography mask as an effective approach to make an angled pattern by bending the light. However, one major problem with using the prism involves aligning the prism to the mask and then the mask to the substrate, which is extremely challenging. Any misalignment between the prism and the mask typically results in overlay errors in the resist/substrate by having a rotation of angled patterns in unintended directions (e.g., in the x-direction and/or y-direction).

BRIEF DESCRIPTION OF THE DRAWINGS

Embodiments described herein illustrated by way of example and not limitation in the figures of the accompanying drawings, in which like references indicate similar features. Furthermore, some conventional details have been omitted so as not to obscure from the inventive concepts described herein.

DETAILED DESCRIPTION

Figure 1:
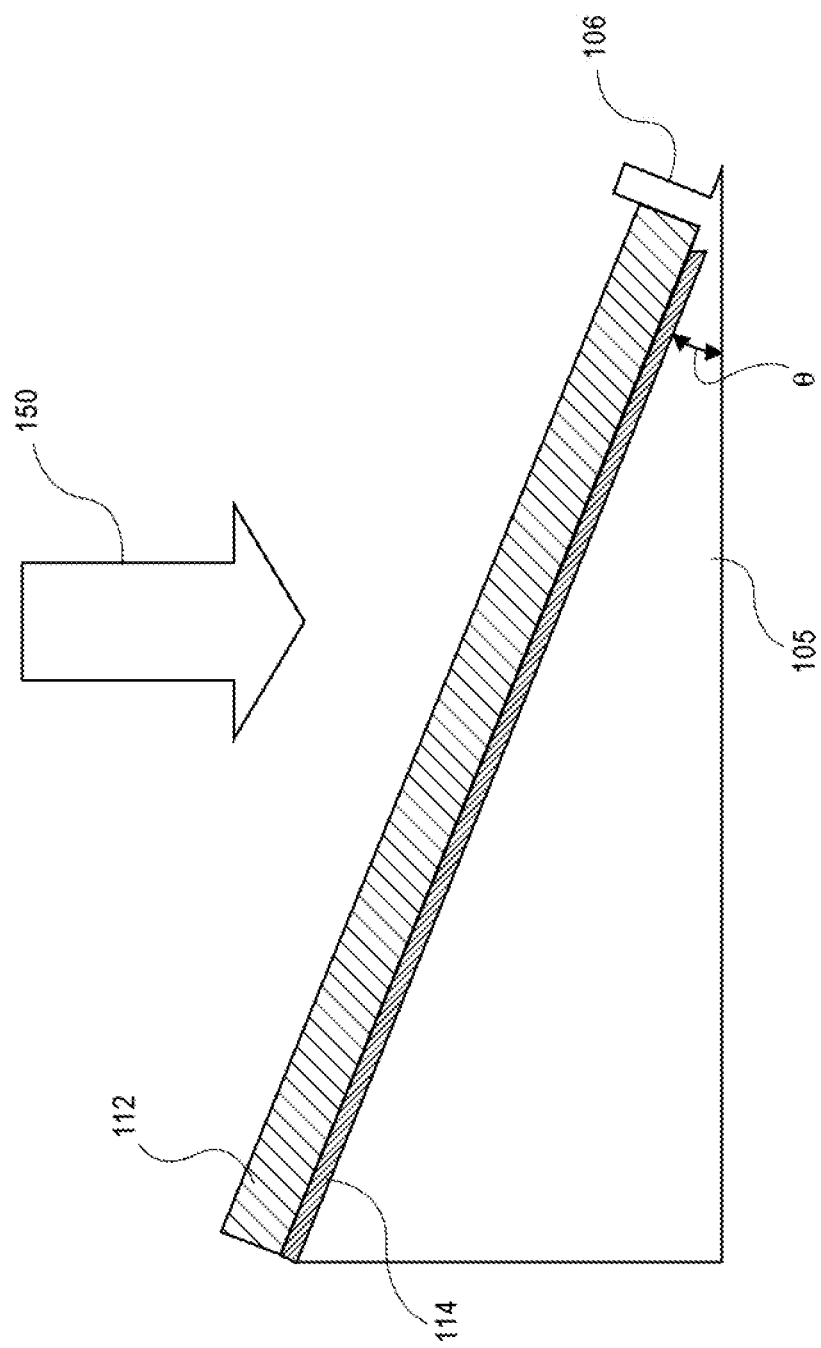
FIG. 1 is an illustration of a cross-sectional view of a vertical projection lithography system with a stage that is at an angle.

Described herein are monolithic prism-masks having patterned surfaces that enable patterning and forming conductive features in non-perpendicular directions on a substrate (e.g., angled/tilted vias, lines, traces, pads, etc.). The embodiments described below include monolithic prism-masks, methods and systems to lithographically pattern conductive features of semiconductor devices in directions that are non-perpendicular to one or more surfaces (or layers) on the substrate.

The technologies described herein may be implemented in one or more electronic devices. Non-limiting examples of electronic devices that may utilize the technologies described herein include any kind of mobile device and/or stationary device, such as microelectromechanical systems (MEMS) based electrical systems, gyroscopes, advanced driving assistance systems (ADAS), 5G communication systems, cameras, cell phones, computer terminals, desktop computers, electronic readers, facsimile machines, kiosks, netbook computers, notebook computers, internet devices, payment terminals, personal digital assistants, media players and/or recorders, servers (e.g., blade server, rack mount server, combinations thereof, etc.), set-top boxes, smart phones, tablet personal computers, ultra-mobile personal computers, wired telephones, combinations thereof, and the like. Such devices may be portable or stationary. In some embodiments, the technologies described herein may be employed in a desktop computer, laptop computer, smart phone, tablet computer, netbook computer, notebook computer, personal digital assistant, server, combinations thereof, and the like. More generally, the technologies described herein may be employed in any of a variety of electronic devices, including substrates having conductive features in non-perpendicular directions such as tilted vias, tilted lines/traces, tilted pads, and the like.

In the following description, various aspects of the illustrative implementations will be described using terms commonly employed by those skilled in the art to convey the substance of their work to others skilled in the art. However, it will be apparent to those skilled in the art that the present embodiments may be practiced with only some of the described aspects. For purposes of explanation, specific numbers, materials and configurations are set forth in order to provide a thorough understanding of the illustrative implementations. However, it will be apparent to one skilled in the art that the present embodiments may be practiced without the specific details. In other instances, well-known features are omitted or simplified in order not to obscure the illustrative implementations.

Various operations will be described as multiple discrete operations, in turn, in a manner that is most helpful in understanding the present embodiments, however, the order of description should not be construed to imply that these operations are necessarily order dependent. In particular, these operations need not be performed in the order of presentation.

As used herein the terms "top," "bottom," "upper," "lower," "lowermost," and "uppermost" when used in relationship to one or more elements are intended to convey a relative rather than absolute physical configuration. Thus, an element described as an "uppermost element" or a "top element" in a device may instead form the "lowermost element" or "bottom element" in the device when the device is inverted. Similarly, an element described as the "lowermost element" or "bottom element" in the device may instead form the "uppermost element" or "top element" in the device when the device is inverted.

As described above, currently available lithography systems are not able to generate patterned features that extend into the resist layer in directions other than orthogonally. Some attempts have been made to provide, such non-orthogonal patterned features. For example, as shown in FIG. 1, a substrate 114 and a mask 112 may be disposed on a stage 105 that may have a major surface that is tilted at an angle θ. By tilting the substrate 114 at an angle θ, an optical path of incoming actinic radiation 150 is no longer orthogonal to the substrate 114, attempting to thus form non-orthogonal patterned features. The optical path of incoming actinic radiation 150 may be passed through a transparent optical element that may be disposed on top of the mask 112. However, such lithography systems have significant problems and disadvantages One problem is that the actual projected angle inside the resist, which may be placed between the substrate 114 and the mask 112, will be lower than the angle to which stage is tilted due to a higher refractive index of the mask and the resist compared to air. The theoretic upper bound of the angle inside the resist will be the critical angle defined by the refractive index of the resist and air.

Another problem involves the alignment of the transparent optical element on the mask, and then the mask on the substrate. Any misalignment between the transparent optical element and the mask results in having a rotation of angled patterns in unintended directions, which respectively leads to patterning overlay errors.

One additional problem is that existing approaches implement an optical gel to bond the mask 112 to the transparent optical element—but with no fine alignment. For example, the mask 112 may be affixed with a custom jig to avoid any movement in the x-y direction, which may later cause fine alignment issues (i.e., overlay errors).

Accordingly, some major disadvantages with the vertical projection lithography system of FIG. 1 include: (1) The general requirement of optical gel to attach the mask 112 to the transparent optical element. Any defects in the optical gel typically cause defects in the resist pattern. In addition, any small refractive index difference between the optical gel and the transparent optical element results in bending the light and changing the required angle. (2) When using the optical gel, there can be sliding of the transparent optical element on top of the mask 112 and consequently rotation of the patterned vias or lines with respect to the x-y surface such as the substrate 114. (3) Since the edge of the mask 112 is used as a physical datum for aligning the transparent optical element, the x-y dimensional tolerances of the mask 112 are extremely critical. Deviations from the nominal dimensions of the mask 112 lead to rotational inaccuracies in the angled resist pattern, and thus inaccuracies in the formed vias or lines. (4) When the optical path of incoming actinic radiation 150 passes through any object and across interfaces, the intensity of the light decreases and it produces light reflections at each of the objects and interfaces that can decrease patterning resolution through optical interference. For example, when the optical path of incoming actinic radiation 150 passes through the transparent optical element, the optical gel, the mask 112, and the optical liquid (e.g., water) to reach the resist on the substrate 114, the light intensity of the optical path of incoming actinic radiation 150 reduces and increases the light reflection at each object.

Furthermore, another problem of FIG. 1 is that a high percentage of exposure energy is lost due to reflection when the light hits the glass surface at high angles. As defined by Fresnel reflection equations, larger portions of the actinic radiation will be reflected as the incident angle approaches 90°, making it is not practical to achieve the tilt angle inside the resist even before the critical angle is reached. Accordingly, the practical limit of the tilt angle inside the resist is about 25°.

One major disadvantage with the approach illustrated in FIG. 1 is the actual implementation of the tilted stage in a volume manufacturing environment. Particularly, as the tilt angle θ is increased, the tilted stage 105 will need a larger clearance in the z-direction, so as to be compatible with existing panel process infrastructures. For example, if the stage is tilted an angle θ of 45°, the z-direction clearance will need to be as much as the substrate length (e.g., the length of a full panel or wafer). In addition, if the substrate 114 is brittle, such as a glass panel substrate, tilting the stage 105 becomes undesirable. For example, as shown in FIG. 1, the tilted stage 105 requires a footing 106 in order to prevent the substrate from slipping. The footing 106 may put a high stress on the panel. This may cause glass to crack, leading to even more complicated stage design requirements. As such, the substrate may rest on a stage that is substantially parallel, and the problems referenced above are mitigated.

Accordingly, embodiments described herein include lithography systems that enable off-angle patterning by using one or more monolithic prisms to change the optical path of actinic radiation rather than relying on, for example, a mask, an optic gel (or the like), a tilted stage, and/or a footing. As used herein, a "monolithic prism" (also referred to as a monolithic prism-mask) refers to a prism formed of a single, uniform object that is implemented for angled patterning. The "monolithic prism" described herein includes a surface (e.g., a bottom surface) with chrome patterning that forms a masked layer on that surface. For example, rather than requiring an isolated mask layer (or a separate mask) as used with existing technologies, the monolithic prism has a plurality of surfaces where a first surface includes a masked layer (i.e., a chromed patterned surface) that may function similarly to a traditional photolithography mask. The masked layer of the monolithic prism, however, improves lithographic patterning by enabling an actinic radiation source (e.g., light) to pass through the masked layer on the first surface without any alignment error as the mask and prism are embedded as a single, uniform object (i.e., a monolithic prism-mask).

Accordingly, the one or more lithographic patterning systems described herein improve lithographic solutions by patterning a mask layer directly on a surface (or the bottom surface) of the prism to form a monolithic prism-mask—without requiring a prism and a separated/isolated lithography mask having an optical gel at the interface. Embodiments of these lithographic patterning systems provide an improved solution to the stringent overlay requirements of the typical prism-to-mask misalignment errors by substantially avoiding any patterning overlay errors. The lithographic patterning systems described below implement this improved solution by eliminating the optical gel and the separated mask from the optical path (or light path), thereby reducing harmful reflection and light intensity attenuations. Embodiments of these lithographic patterning systems enable patterning tilted vias or lines on a substrate without any misalignment error by removing the requirements of separate physical masks and optical gels. In addition, these embodiments described herein facilitate reducing reflections from the optical gel and mask interfaces which are substantially detrimental to pattern resolution.

Figure 2:
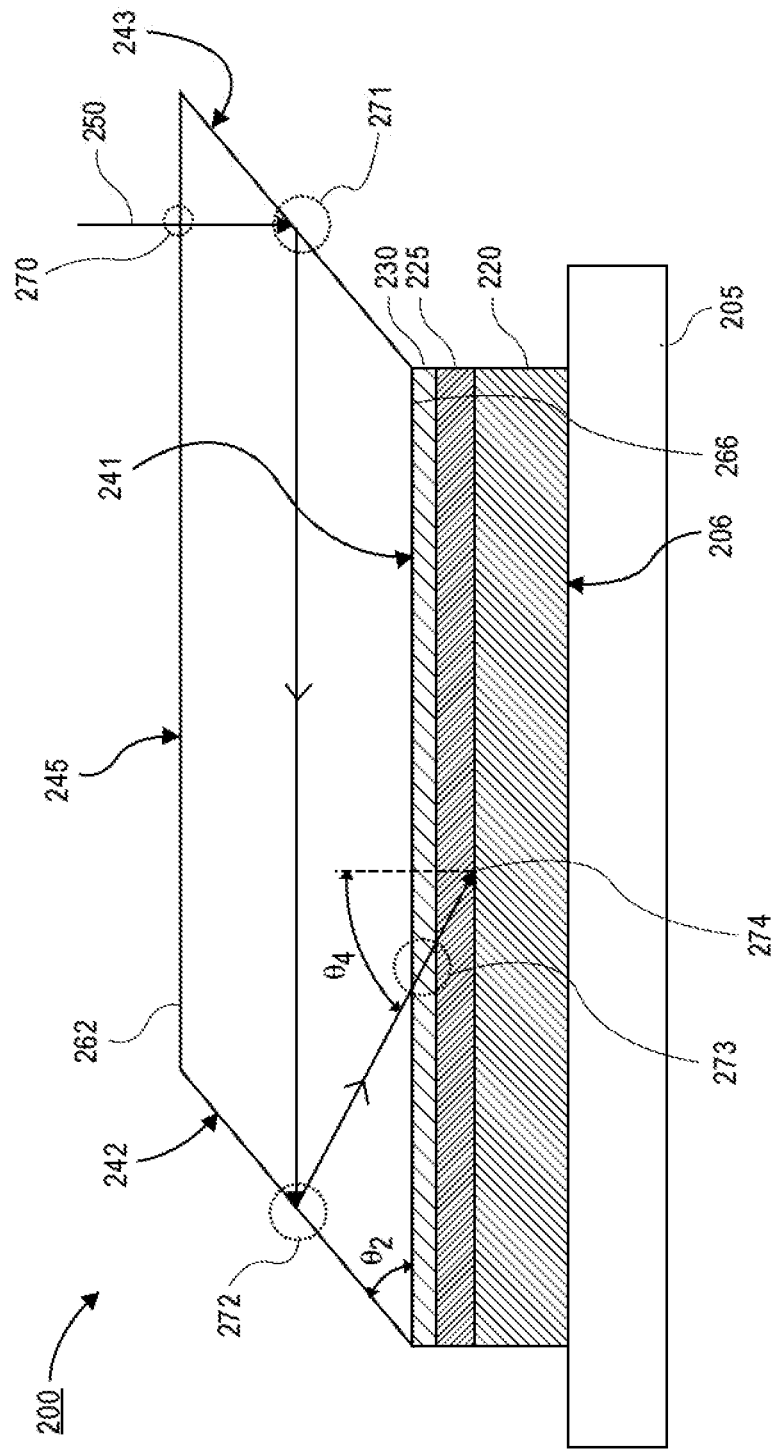
FIG. 2 is an illustration of a cross-sectional view of a lithography system that includes a monolithic prism-mask that enables off-angled patterning of a resist layer, according to one embodiment.

FIG. 2 is an illustration of a cross-sectional view of a lithography system 200 (or a lithography patterning system) that includes a monolithic prism-mask 262 that enables off-angled patterning of a resist layer 225, according to one embodiment.

For some embodiments, the lithography system 200 includes an actinic radiation source 250, a stage 205, and the prism 262 (i.e., the monolithic prism-mask). In an embodiment, the prism 262 is disposed over (or above) the stage 205, where a surface 206 (or a major surface on the top surface) of the stage 205 is for supporting a substrate 220 with the resist layer 225. In some embodiments, the prism 262 includes a first surface 241 (or a bottom surface) that is substantially parallel to the surface 206 of the stage 205. Additionally, the prism 262 has a masked layer 266 disposed on the first surface 241 of the prism 262.

In one embodiment, the prism 262 includes a second surface 245 that is substantially parallel to the first surface 241, where the first and second surfaces 241 and 245 are flat surfaces, and where the prism 262 may be formed of one or more transparent materials. For some embodiments, the actinic radiation source 250 may supply light to the prism 262 and form an optical path through the lithographic patterning system 200 that may exit the first surface 241 of the prism 262 through the mask layer 266.

According to some embodiments, the lithography system 200 may also include a layer 230 between the mask layer 266 and the resist layer 225. As illustrated in FIG. 2, in some embodiments, the mask layer 266 of the prism 262 is disposed directly over the layer 230, the resist layer 225, the substrate 220, and the stage 205, respectively.

In an embodiment, the stage 205 may be any suitable stage 205 for supporting the substrate 220 during the lithography process. In an embodiment, the stage 205 may have the top surface 206 (or a major surface) that supports the substrate 220. For one embodiment, the top surface 206 may be substantially parallel to the ground. That is, the top surface 206 is not tilted at any significant angle.

In an embodiment, the substrate 220 may be any substrate that is a suitable candidate for lithographic patterning. Since the major surface 206 is not tilted, there is no need to accommodate an increased Z-height. As such, the substrate 220 may be any size. For example, the substrate 220 may be a wafer, a panel, a quarter-panel, or any other size. In an embodiment, the lithography system 200 may be suitable for processing substrates 220 that are used in the fabrication of computing devices (e.g., transistor devices, packaging layers, etc.) and/or for the fabrication of micro-electromechanical systems (MEMS), or the like.

According to some embodiments, the substrate 220 may include, but is not limited to, a package, a substrate, a printed circuit board (PCB), and/or a motherboard. For one embodiment, the substrate 220 is a PCB. For one embodiment, the PCB is made of an FR-4 glass epoxy base with thin copper foil laminated on both sides. For certain embodiments, a multilayer PCB can be used, with pre-preg and copper foil used to make additional layers. For example, the multilayer PCB may include one or more dielectric layers, where each dielectric layer can be a photosensitive dielectric layer. For some embodiments, holes may be drilled in the PCB 202.

Figure 3:
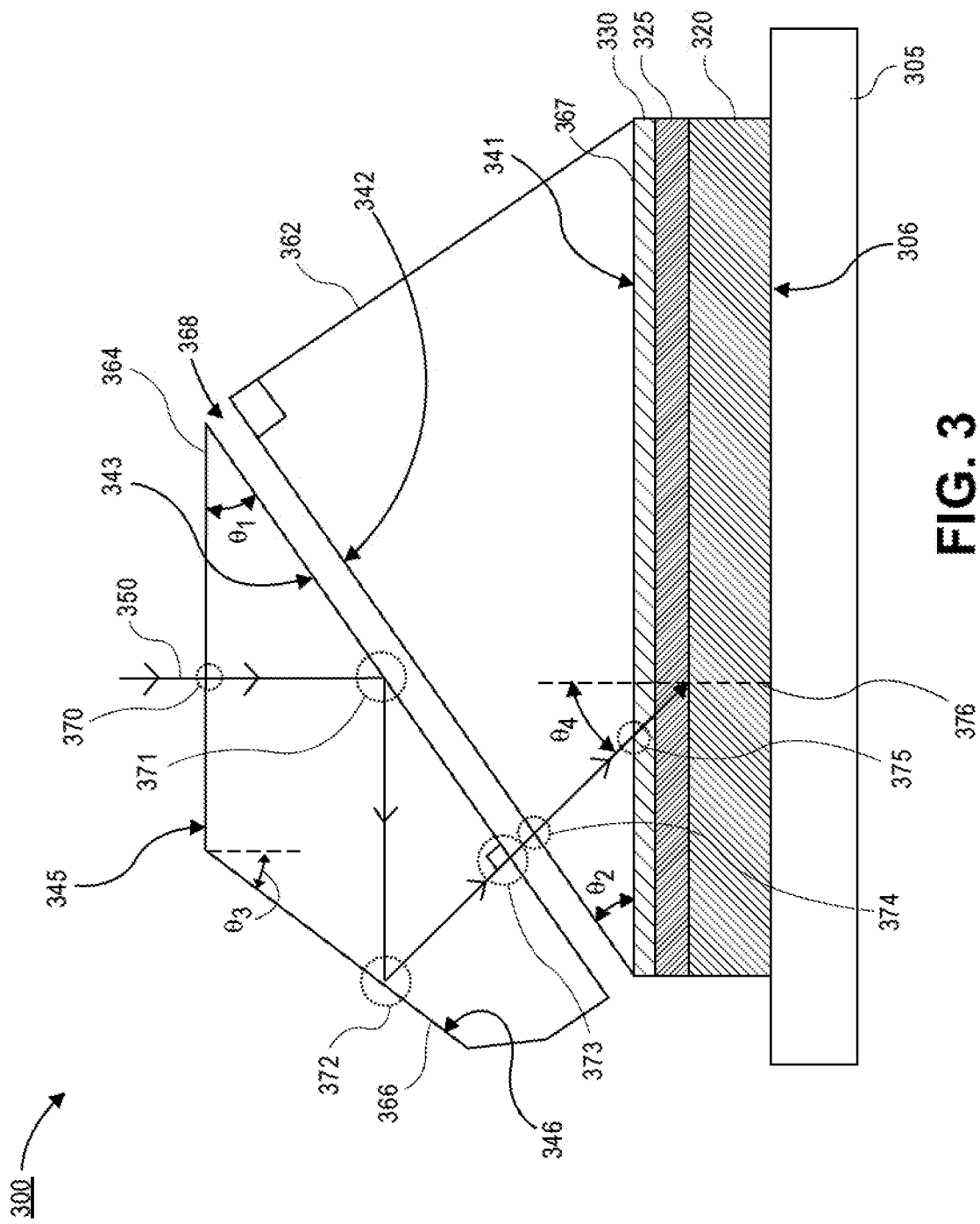
FIG. 3 is an illustration of a cross-sectional view of a lithography system that includes a first monolithic prism-mask and a second prism that enables off-angled patterning of a resist layer, according to one embodiment.

For one embodiment, the PCB 202 may also include conductive layers having one or more conductive features, such as copper lines/traces, metallic pads, vias, via pads, planes, and/or holes—where some of these conductive features may include one or more patterned features such as angled (or tilted/slanted) vias, via pads, lines/traces, and so on that are formed using the lithographic patterning systems described herein (e.g., the lithographic system 200, and/or the lithographic system 300 of FIG. 3). Note that, as used herein, an "angled" (or tilted/slanted) feature refers to a patterned feature on a substrate that extends out from a surface on the substrate at a non-orthogonal angle with respect to the surface. Additionally, in one embodiment, the "angled" patterned feature may be formed by patterning the resist layer 225 (or the like) on the substrate 220 to form an opening (or an angled opening) in the resist layer 225, and then disposing (or depositing) a conductive material in the opening to form the angled patterned feature.

For one embodiment, a resist layer 225 may be disposed on a top surface of the substrate 220. In an embodiment, the resist layer 225 may be a layer of material that undergoes a chemical reaction when exposed to actinic radiation generated by the lithography system 200. In a particular embodiment, the resist layer 225 may be referred to as a photoresist layer. Embodiments include resist layers 225 that are both positive tone and negative tone photoresist layers. While the resist layer 225 in FIG. 2 is shown as covering the entire top surface of the substrate 220, it is to be appreciated that the resist layer 225 may cover only portions of the substrate 220.

In an embodiment, the resist layer 225 may be patterned with the mask layer 266 of the prism 262. That is, the actinic radiation 250 may travel along the optical path 250 that passes through the mask layer 266 of the prism 262 and intersects with portions of the resist layer 225 exposed through by the mask layer 266. The actinic radiation 250 may initiate a chemical reaction in the resist layer 225, and the resist layer 225 may be developed (i.e., removal of the reacted portions or the unreacted portions, depending on the tone of the resist) with a developing solution to form an opening (or an angled opening) in the resist layer 225 and over the substrate 220.

As shown in FIG. 2, the optical path 250 may intersect with the resist layer 225 at a non-orthogonal angle $\theta_4$. Accordingly, embodiments may include patterned features (as described above) that extend into the resist layer 225 in a non-orthogonal direction to a surface of the resist layer 225. In some embodiments, the resist layer 225 may be used to subsequently pattern portions of the underlying substrate 220. That is, the pattern of the resist layer 225 may be transferred into the surface of the substrate 220 and the resist layer 225 may be stripped away. In additional embodiments, the resist layer 225 may be a photoimageable dielectric. In such embodiments, the resist layer 225 may remain in portions of the final device fabricated, in part, with the lithography system 200.

According to an embodiment, the optical path 250 may pass through the prism 262. In an embodiment, the prism 262 may be a flat prism, such as a rectangular prism, a square prism, and/or the like. In an embodiment, the first surface 241 (i.e., the surface opposite to the second surface 245) may be substantially parallel to the surface 206 of the stage 205. The actinic radiation 250 may be illustrated as propagating through the lithography system 200 (e.g., from an actinic light source (or a similar lithographic tool)) to the resist layer 225 along the optical path 250. As indicated by the direction of the arrows along the optical path 250, the optical path 250 may first enter the prism 262 at location 270. As shown at location 270, the optical path 250 enters into the prism 262 by passing through the second surface 245 of the prism 262. In an embodiment, the optical path 250 may be substantially orthogonal to the second surface 245 of the prism 262 at location 270. However, embodiments are not limited to such configurations.

In an embodiment, the optical path 250 continues by passing through the prism 262 until the optical path 250 reflects off of a third surface 243 of the prism 262 at location 271. In an embodiment, the angle of the optical path 250 with respect to the third surface 243 may result in a total internal reflection. That is, even though the third surface 243 of the prism 262 may not have a reflective coating, the optical path 250 still entirely reflects towards a fourth surface 242 of the prism 262, where the third surface 243 may be substantially parallel to the fourth surface 242.

In an embodiment, the optical path 250 continues to pass through the prism 262 until the optical path 250 reflects off the fourth surface 242 of the prism 262 at location 272. For one embodiment, the fourth surface 242 may have a reflective coating. As noted above, substantially all of the actinic radiation 250 traveling along optical path 250 may be reflected by the fourth surface 242 of the prism 262. In an embodiment, the optical path 250 passes through the prism 262 again until the optical path 250 exits along the first surface 241 of the prism 262 at location 273. As illustrated in FIG. 2, the angles $\theta_2$ and the $\theta_4$ may be such that the optical path 250 passes through the mask layer 266 of the first surface 241, the layer 230, and the resist layer 225 at an orthogonal angle at the location 273, where the optical path 250 may end at the location 274.

For some embodiments, the optical path 250 may exit the prism 262 at an angle $\theta_4$ with respect to normal. In an embodiment, the angle $\theta_4$ may be substantially the same as the angle $\theta_2$. In other embodiments, the angle $\theta_4$ may be different than the angle $\theta_2$. After exiting the prism 262 at location 273, the optical path 250 may pass through one or more openings (not shown) formed on the mask layer 266 of the prism 262 and may then intersect with the resist layer 225.

In an embodiment, one or more layers 230 may also be included in the lithography system 200. The layer(s) 230 may be an index of refraction matching layer, for example, the layer 230 may be disposed between the first surface 241 of the prism 262 and the resist layer 225. In an embodiment, the layer 230 may have an index of refraction that is substantially equal to an index of refraction of the prism 262. Accordingly, when the actinic radiation 250 exits the prism 262 along the optical path 250, the angle of the optical path will not substantially change.

Since the stage 205 is not tilted, the index of refraction matching layer 230 may be any suitable materials, including low viscosity materials. Whereas a low viscosity material, such as water, cannot be used on a tilted stage since gravity will prevent the layer from staying in place, a non-tilted stage 205 allows for low viscosity materials to be used for the index of refraction matching layer 230. In an embodiment, the layer 230 may comprise, but is not limited to, water, gels, liquids, or any other suitable material layer. For one embodiment, the layer 230 may be a low viscosity material. In another embodiment, the layer 230 may be a high viscosity material.

Accordingly, in one embodiment, the optical path 250 may intersect the resist layer 225 at a fourth angle $\theta_4$ that may be approximately 45°. However, embodiments are not limited to such configurations. For example, the angle $\theta_2$ may be increased in order to increase the angle $\theta_4$. In order to decrease the patterning angle $\theta_4$ (i.e., to make the patterning angle closer to orthogonal), the angle $\theta_2$ may be decreased. However, there is a practical limit on how much the angle $\theta_2$ can be reduced since the first reflection at location 271 requires a total internal refraction. With a high index of refraction material (e.g., an index of refraction of approximately 1.75), the angle $\theta_2$ may be set as low as approximately 35°. However, it is to be appreciated that embodiments are not limited to such angles. For example, additional changes to the geometry of the prism 262 may be made in order to obtain any desired patterning angles.

In some embodiments, the lithographic patterning system 200 may implement a patterned layer, such as the resist layer 225, over the substrate 220, where the patterned resist layer 225 may be disposed on a surface (or a top surface) of the substrate 220. In one embodiment, the lithographic patterning system 200 may form a plurality of patterned features over the surface of the substrate 220, where the patterned features may extend out from the surface of the substrate 220 at a non-orthogonal angle with respect to the surface. In one embodiment, the patterned features may be used to form a first angled via with a first variation angle that is approximately equal to a second variation angle of a second patterned via.

According to some embodiments, the lithographic patterning system 200 may pattern the resist layer 225 to form one or more openings (or holes, lines, etc.). It is to be appreciated that the resist layer 225 may have openings with any desired shape or dimension attainable by the lithographic system 200. Additionally, it is to be appreciated that holes, lines, or any other patterned feature may be patterned into the resist layer 225. For example, the resist layer 225 may be patterned to have one or more patterned features that may extend down through the resist layer 225 at an angle $\theta$ based on the desired packaging design. That is, the patterned features of the resist layer 225 may include the patterned openings (or holes) which may have sidewalls that are an angle $\theta$ with respect to the surface 206 of the substrate 220. In an embodiment, the angle $\theta$ may be a non-orthogonal angle. For example, the angle $\theta$ may be less than 90°, less than 45°, or less than 30°. In a particular embodiment, the angle $\theta$ may be between 20° and 90°.

In some embodiments, the masked layer 266 of the first surface 241 of the prism 262 may be used as a lithographic mask to form the patterned resist layer 225 and then selectively deposit a conductive layer over the underlying substrate 220. That is, the conductive layer may include a material (e.g., copper or the like) that is deposited into the openings of the patterned resist layer 225, and the patterned resist layer 225 may subsequently be stripped away to leave a conductive layer with non-vertical conductive, patterned features. Note that, in additional embodiments, the resist layer 225 may be a photoimageable dielectric. Also note that, in such embodiments, the resist layer 225 may remain in portions of the final electronic device fabricated, in part, with a lithography system, such as the lithography system 200 described above and/or the lithography system 300 of FIG. 3 described below.

Note that the lithography system 200 of FIG. 2 may include fewer or additional packaging components based on the desired packaging design.

FIG. 3 is an illustration of a cross-sectional view of a lithography system 300 that includes a second prism 364 and a first monolithic prism-mask 362 (or a first prism 362) that enables off-angled patterning of a resist layer 325, according to one embodiment. In an embodiment, the lithography system 300 may comprise a stage 305, a first prism 362, and a second prism 364. In an embodiment, the stage 305 may be any suitable stage 305 for supporting a substrate 320 during the lithography process. In an embodiment, the stage 305 may have a major surface 306 that supports the substrate 320. In an embodiment, the major surface 306 may be substantially parallel to the ground. That is, the major surface 306 is not tilted at any significant angle.

In an embodiment, the substrate 320 may be any substrate that is a suitable candidate for lithographic patterning. Since the major surface 306 is not tilted, there is no need to accommodate an increased Z-height. As such, the substrate 320 may be any size. For example, the substrate 320 may be a wafer, a panel, a quarter-panel, or any other size. In an embodiment, the lithography system 300 may be suitable for processing substrates 320 that are used in the fabrication of computing devices (e.g., transistor devices, packaging layers, etc.) and/or for the fabrication of MEMS, or the like.

For some embodiments, the actinic radiation source 350 may supply light to the second prism 364 and the first prism 362 to form an optical path through the lithographic patterning system 300 that may exit the first surface 341 of the first prism 362 through a mask layer 367 on a first surface 341. Note that the mask layer 367 is similar to the mask layer 266 of FIG. 2 described above. According to some embodiments, the lithography system 300 may also include a layer 330 between the mask layer 367 and the resist layer 325. As illustrated in FIG. 3, in some embodiments, the mask layer 367 of the first prism 362 is disposed directly over the layer 330, the resist layer 325, the substrate 320, and the stage 305, respectively.

In an embodiment, a resist layer 325 may be deposited over a top surface of the substrate 320. In an embodiment, the resist layer 325 may be a layer of material that undergoes a chemical reaction when exposed to actinic radiation generated by the lithography system 300. In a particular embodiment, the resist layer 325 may be referred to as a photoresist layer. Embodiments include resist layers 325 that are both positive tone and negative tone photoresist layers. While the resist layer 325 is shown as covering the entire top surface of the substrate 320, it is to be appreciated that the resist layer 325 may cover only portions of the substrate 320.

In an embodiment, the resist layer 325 may be patterned with the mask layer 367 of the first prism 362. That is, the actinic radiation 350 may travel along the optical path 350 that passes through the mask layer 367 of the first prism 362 and thus intersects with portions of the resist layer 325 that are exposed by the mask layer 367 of the first prism 362. The actinic radiation 350 may initiate a chemical reaction in the resist layer 325, and the resist layer 325 may be developed (i.e., removal of the reacted portions or the unreacted portions, depending on the tone of the resist) with a developing solution.

As shown in FIG. 3, the optical path 350 may intersect with the resist layer 325 at a non-orthogonal angle $\theta_4$. Accordingly, embodiments may include patterned features that may extend into the resist layer 325 in a non-orthogonal direction to a surface of the resist layer 325, as will be described in greater detail below with respect to FIG. 3. In some embodiments, the resist layer 325 may be used to subsequently pattern portions of the underlying substrate 320. That is, the pattern of the resist layer 325 may be transferred into the surface of the substrate 320 and the resist layer 325 may be stripped away. In additional embodiments, the resist layer 325 may be a photoimageable dielectric. In such embodiments, the resist layer 325 may remain in portions of the final device fabricated, in part, with the lithography system 300.

According to an embodiment, the optical path 350 may pass through a first prism 362 and a second prism 364. In an embodiment, the first prism 362 may be a right angle prism. In an embodiment, a first surface 341 (i.e., the surface opposite to the right angle) may be substantially parallel to the major surface 306 of the stage 305. In an embodiment, the second prism 364 may be a half-penta prism. In an embodiment, the second prism 364 may have a first surface 343 that is substantially parallel to a second surface 342 of the first prism 362.

In an embodiment, the first surface 343 of the second prism 364 may be spaced away from the second surface 342 of the first prism 362 by an air gap 368. The presence of an air gap 368 between the surfaces 343 and 342 allows for total internal reflection of the optical path at point 371, as will be described in greater detail below. While referred to herein as an "air gap", it is to be appreciated that the air gap 368 may comprise any fluid constituents including gasses and liquids (e.g., the lithography system 300 may be an immersion lithography system).

In an embodiment, the second prism 364 may have a second surface 345 that intersects with the first surface 343 to form a first angle $\theta_1$. In an embodiment, the second surface 345 may be substantially parallel to the major surface 306 of the stage 305. In an embodiment, the first angle $\theta_1$ may be substantially equal to a second angle $\theta_2$ formed at the intersection of the first surface 341 of the first prism 362 and the second surface 342 of the first prism 362. Choosing the first angle $\theta_1$ to be substantially equal to the second angle $\theta_2$ ensures that reflected actinic radiation 350 will not introduce an unwanted secondary light path.

In an embodiment, the second prism 364 may have a third surface 346 that intersects with the second surface 345 at a third angle $\theta_3$. In an embodiment, the third surface 346 may have a reflective coating 366 that reflects a high percentage of the actinic radiation used in the system. In other embodiments, the third surface 346 may already be formed of one or more reflective materials, as such the reflective coating 366 may be omitted. In an embodiment, the third angle $\theta_3$ may be an angle chosen such that the reflected actinic radiation 350 exits second prism 364 at an angle orthogonal to the first surface 343 of the second prism 364. Since the first surface 343 of the second prism 364 is parallel to the second surface 342 of the first prism 362, the optical path 350 enters the first prism 362 at an orthogonal angle to the second surface 342 of the first prism 362 as well. In a particular embodiment, the third angle $\theta_3$ may be approximately one-half the first angle $\theta_1$.

In an embodiment, the first prism 362 and the second prism 364 may be any suitable materials. In an embodiment, the first prism 362 and the second prism 364 may be the same material. That is, in some embodiments, the index of refraction of the first prism 362 substantially matches the index of refraction of the second prism 364. However, it is to be appreciated that other embodiments may include a first prism 362 that has a different refractive index than the second prism 364.

In FIG. 3, actinic radiation is shown as propagating through the lithography system 300 from an actinic light source (not shown) to the resist layer 325 along an optical path 350. As indicated by the direction of the arrows along the optical path 350, the optical path 350 first enters the second prism 364 at location 370. As shown at location 370, the optical path 350 enters into the second prism 364 by passing through the second surface 345 of the second prism 364. In an embodiment, the optical path 350 may be substantially orthogonal to the second surface 345 of the second prism at location 370. However, embodiments are not limited to such configurations.

In an embodiment, the optical path 350 continues by passing through the second prism 364 until the optical path 350 reflects off of the first surface 343 of the second prism 364 at location 371. In an embodiment, the angle of the optical path 350 with respect to the first surface 343 combined with the index of refraction differences between the second prism 364 and the air gap 368 may result in a total internal reflection. That is, even though the first surface 343 of the second prism 364 does not have a reflective coating, the optical path still entirely reflects towards the third surface 346 of the second prism 364.

In an embodiment, the optical path 350 passes again through the second prism 364 until the optical path 350 reflects off of the reflective coating 366 on the third surface 346 of the second prism 364 at location 372. As noted above, substantially all of the actinic radiation traveling along optical path 350 may be reflected by the reflective coating 366. In an embodiment, the optical path 350 passes through the second prism 364 again until the optical path passes through the first surface 343 of the second prism 364 at location 373. As noted above, the third angle $\theta_3$ may be such that the optical path 350 passes through the first surface 343 into the air gap 368 at an orthogonal angle.

In an embodiment, the optical path 350 next passes through the air gap 368 and passes through the second surface 342 of the first prism 362 at location 374. As noted above, since the second surface 342 of the first prism 362 is parallel to the first surface 343 of the second prism 364, the optical path 350 passes through the second surface 342 of the first prism at an orthogonal angle.

In an embodiment, the optical path 350 may then continue through the first prism 362 until it exits along the first surface 341 of the first prism 362 at location 375. In an embodiment, the optical path 350 may exit the first prism 362 at a fourth angle $\theta_4$ with respect to normal. In an embodiment, the fourth angle $\theta_4$ may be substantially the same as the first angle $\theta_1$. Accordingly, the optical path 350 passes through the mask layer 367 of the first surface 341 of the first prism 362, the layer 330, and the resist layer 325 at an orthogonal angle at the location 375, where the optical path 350 may end at the location 376. After exiting the first prism 362, the optical path 350 may pass through openings (not shown) patterned on the mask layer 367 on the first surface 341, continue through the openings of the mask layer 367 through the optical liquid layer 330, and then intersect with the resist layer 325.

As also illustrated in FIG. 3, the first angle $\theta_1$ is illustrated as being approximately 45°. Accordingly, the optical path 350 may intersect the resist layer at a fourth angle $\theta_4$ that is also approximately 45°. However, embodiments are not limited to such configurations. For example, the first angle $\theta_1$ and the second angle $\theta_2$ may be increased in order to increase the fourth angle $\theta_4$. In order to decrease the patterning angle $\theta_4$ (i.e., to make the patterning angle closer to orthogonal), the first angle $\theta_1$ and the second angle $\theta_2$ may be decreased. However, there is a practical limit on how much the first angle $\theta_1$ can be reduced since the first reflection at location 371 requires a total internal refraction. With a high index of refraction material (e.g., an index of refraction of approximately 1.75), the first angle $\theta_1$ may be set as low as approximately 35°. However, it is to be appreciated that embodiments are not limited to such angles. For example, additional changes to the geometry of the second prism 364 may be made in order to obtain even lower patterning angles $\theta_4$.

Note that, as those skilled in the art will appreciate, the precise angles needed for each face of the second prism 364 may be obtained by calculations based on geometry and the use of Snell's law. Also note that the lithography system 300 of FIG. 3 may include fewer or additional packaging components based on the desired packaging design.

Figure 4:
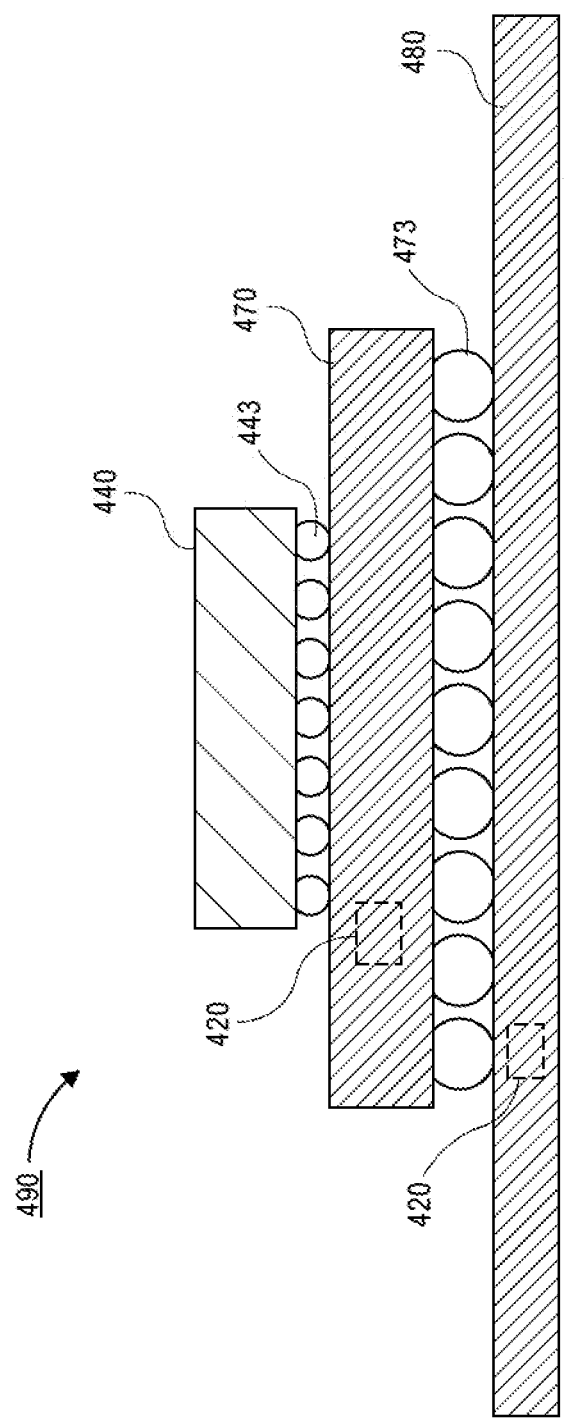
FIG. 4 is an illustration of a cross-sectional view of an electronic package that includes one or more non-vertical structures, according to one embodiment.

Referring now to FIG. 4, a cross-sectional illustration of a packaged system 490 is shown, in accordance with an embodiment. In an embodiment, the packaged system 490 may include a die 440 electrically coupled to a package substrate 470 with solder bumps 443. In additional embodiments, the die 440 may be electrically coupled to the package substrate 470 with any suitable interconnect architecture, such as wire bonding or the like. The package substrate 470 may be electrically coupled to a board 480, such as a printed circuit board (PCB) with solder bumps 473 or any other suitable interconnect architecture, such as wire bonding or the like.

In an embodiment, features 420 patterned at a non-orthogonal angle similar to embodiments described above may be integrated into the die 440, the package substrate 470 and/or the board 480. Embodiments include any number of features 420 patterned at a non-orthogonal angle formed into the die 440, the package substrate 470 and/or the board 480. For example, a plurality of features 420 (or a plurality of patterned conductive features) patterned at a non-orthogonal angle may be integrated into the circuitry of the die 440, the package substrate 470 and/or the board 480 for any other desired use.

Figure 5:
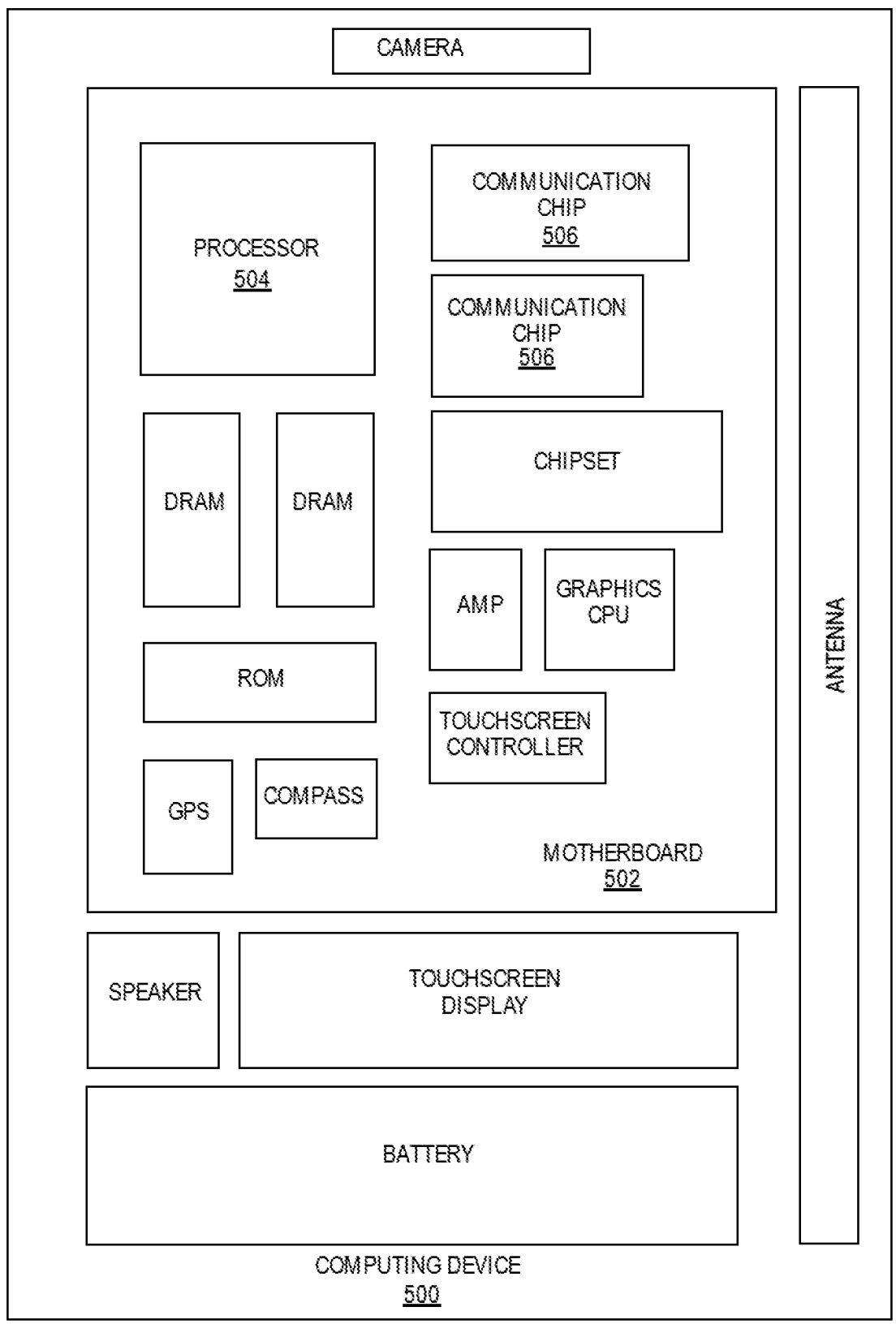
FIG. 5 is an illustration of a schematic block diagram illustrating a computer system that utilizes a substrate having one or more non-vertical structures, according to one embodiment.

FIG. 5 illustrates a computing device 500 in accordance with one implementation of the invention. The computing device 500 houses a board 502. The board 502 may include a number of components, including but not limited to a processor 504 and at least one communication chip 506. The processor 504 is physically and electrically coupled to the board 502. In some implementations the at least one communication chip 506 is also physically and electrically coupled to the board 502. In further implementations, the communication chip 506 is part of the processor 504.

These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 506 enables wireless communications for the transfer of data to and from the computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 506 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 500 may include a plurality of communication chips 506. For instance, a first communication chip 506 may be dedicated to shorter range wireless communications such as Wi-Fi and Bluetooth and a second communication chip 506 may be dedicated to longer range wireless communications such as GPS, EDGE, GPRS, CDMA, WiMAX, LTE, Ev-DO, and others.

The processor 504 of the computing device 500 includes an integrated circuit die packaged within the processor 504. In some implementations of the invention, the integrated circuit die of the processor may be communicatively coupled to a device with features patterned at a non-orthogonal angle, in accordance with embodiments described herein. The term "processor" may refer to any device or portion of a device that processes electronic data from registers and/or memory to transform that electronic data into other electronic data that may be stored in registers and/or memory.

The communication chip 506 also includes an integrated circuit die packaged within the communication chip 506. In accordance with another implementation of the invention, the integrated circuit die of the communication chip may be communicatively coupled to a device with features patterned at a non-orthogonal angle, in accordance with embodiments described herein.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

In the foregoing specification, embodiments have been described with reference to specific exemplary embodiments thereof. It should be borne in mind, however, that all of these and similar terms are to be associated with the appropriate physical quantities and are merely convenient labels applied to these quantities. It will be evident that various modifications may be made thereto without departing from the broader spirit and scope. The specification and drawings are, accordingly, to be regarded in an illustrative sense rather than a restrictive sense.

The following examples pertain to further embodiments. The various features of the different embodiments may be variously combined with some features included and others excluded to suit a variety of different applications.

The following examples pertain to further embodiments:

Example 1

A lithographic patterning system, comprising: an actinic radiation source; a stage, wherein a surface of the stage is for supporting a substrate with a resist layer; and a prism over the stage, wherein the prism includes a first surface that is substantially parallel to the surface of the stage, and wherein the first surface of the prism has a masked layer.

Example 2

The lithographic patterning system of Example 1, wherein the prism includes a second surface that is substantially parallel to the first surface.

Example 3

The lithographic patterning system of Example 1-2, wherein the prism is a monolithic prism-mask.

Example 4

The lithographic patterning system of Example 1-3, wherein the first and second surfaces are flat surfaces.

Example 5

The lithographic patterning system of Example 1-4, wherein the prism is formed with a transparent material.

Example 6

The lithographic patterning system of Example 1-5, wherein an optical path through the lithographic patterning system exits the first surface of the prism through the mask layer.

Example 7

The lithographic patterning system of Example 1-6, further comprising: a layer between the mask layer and the resist layer.

Example 8

The lithographic patterning system of Example 1-7, wherein the mask layer of the prism is disposed over the layer, the resist layer, the substrate, and the stage.

Example 9

The lithographic patterning system of Example 1-8, wherein the mask layer of the prism patterns the resist layer without an isolated mask layer.

Example 10

The lithographic patterning system of Example 1-9, wherein the layer includes a low viscosity material.

Example 11

The lithographic patterning system of Example 1-10, wherein the layer is water.

Example 12

A lithographic patterning system, comprising: an actinic radiation source; a stage, wherein a surface of the stage is for supporting a substrate with a resist layer; and a first prism over the stage, wherein the first prism includes a first surface that is substantially parallel to the surface of the stage, and wherein the first surface of the prism has a masked layer; and a second prism, wherein the second prism includes a first surface that is substantially parallel to a second surface of the first prism.

Example 13

The lithographic patterning system of Example 12, wherein a second surface of the second prism has a reflective coating, and wherein the first surface of the second prism is separated from the second surface of the first prism by an air gap.

Example 14

The lithographic patterning system of Example 12-13, wherein the second prism is a half-penta prism, and wherein the first prism is a monolithic prism-mask.

Example 15

The lithographic patterning system of Example 12-14, wherein the first prism and the second prism are formed with the same material, and wherein the same material includes one or more transparent materials.

Example 16

The lithographic patterning system of Example 12-15, wherein the second prism has a third surface that is parallel to the surface of the stage.

Example 17

The lithographic patterning system of Example 12-16, wherein the first surface and the third surface of the second prism intersect to form a first angle.

Example 18

The lithographic patterning system of Example 12-17, wherein an optical path through the lithographic patterning system exits the first surface of the first prism through the mask layer of the first prism at the first angle.

Example 19

The lithographic patterning system of Example 12-18, wherein the first angle is 45°.

Example 20

The lithographic patterning system of Example 12-19, wherein the second prism has a third surface that is not parallel to the surface of the stage.

Example 21

The lithographic patterning system of Example 12-20, further comprising: a spacer between the first prism and the second prism; and a layer between the mask layer of first prism and the resist layer, wherein the layer has an index of refraction that matches an index of refraction of the first prism, wherein the layer is a low viscosity material, and wherein the low viscosity material includes water.

Example 22

The lithographic patterning system of Example 12-21, wherein the mask layer of the first prism is disposed over the layer, the resist layer, the substrate, and the stage, and wherein the mask layer of the first prism patterns the resist layer without an isolated mask layer.

Example 22

A microelectronic device, comprising: a substrate; and a patterned layer over the substrate, wherein the patterned layer comprises: a surface; and a plurality of patterned features over the surface, wherein the patterned features extend out from the surface at a non-orthogonal angle with respect to the surface, and wherein the patterned features have a first angled via with a first variation angle that is approximately equal to a second variation angle of a second angled via.

Example 24

The microelectronic device of Example 23, wherein the patterned layer includes a resist layer or a photoimageable dielectric, wherein the patterned features are filled with a material deposited with a deposition process, and wherein the patterned features include one or more angled traces.

Example 25

The microelectronic device of Example 23-24, wherein the non-orthogonal angle is between 20° and 90°, or wherein the non-orthogonal angle is 45°.

In the foregoing specification, methods and apparatuses have been described with reference to specific exemplary embodiments thereof. It will be evident that various modifications may be made thereto without departing from the broader spirit and scope. The specification and drawings are, accordingly, to be regarded in an illustrative sense rather than a restrictive sense.

What is claimed is:
1. A lithographic patterning system, comprising:
   an actinic radiation source;
   a stage, wherein a surface of the stage is for supporting a substrate with a resist layer; and
   a prism over the stage, wherein the prism includes a first surface that is substantially parallel to the surface of the stage, wherein the first surface of the prism has a masked layer, wherein the prism includes a second surface that is substantially parallel to the first surface, and wherein the actinic radiation source is vertically over the second surface.
2. The lithographic patterning system of claim 1, wherein the prism is a monolithic prism-mask.
3. The lithographic patterning system of claim 1, wherein the first and second surfaces are flat surfaces.
4. The lithographic patterning system of claim 1, wherein the prism is formed with a transparent material.
5. The lithographic patterning system of claim 1, wherein an optical path through the lithographic patterning system exits the first surface of the prism through the mask layer.
6. The lithographic patterning system of claim 1, further comprising:
   a layer between the mask layer and the resist layer.
7. The lithographic patterning system of claim 6, wherein the mask layer of the prism is disposed over the layer, the resist layer, the substrate, and the stage.
8. The lithographic patterning system of claim 7, wherein the mask layer of the prism patterns the resist layer without an isolated mask layer.
9. The lithographic patterning system of claim 6, wherein the layer includes a low viscosity material.
10. The lithographic patterning system of claim 9, wherein the layer is water.
11. A lithographic patterning system, comprising:
    an actinic radiation source;
    a stage, wherein a surface of the stage is for supporting a substrate with a resist layer; and a prism over the stage, wherein the prism includes a first surface that is substantially parallel to the surface of the stage, wherein the first surface of the prism has a masked layer, wherein the prism includes a second surface that is substantially parallel to the first surface, and wherein the prism includes a pair of parallel side surfaces between the first surface and the second surface.

12. The lithographic patterning system of claim 11, wherein the actinic radiation source is vertically over the second surface.

13. The lithographic patterning system of claim 11, wherein the prism is a monolithic prism-mask.

14. The lithographic patterning system of claim 11, wherein the first and second surfaces are flat surfaces.

15. The lithographic patterning system of claim 11, wherein the prism is formed with a transparent material.

16. The lithographic patterning system of claim 11, wherein an optical path through the lithographic patterning system exits the first surface of the prism through the mask layer.

17. The lithographic patterning system of claim 11, further comprising:
a layer between the mask layer and the resist layer.

18. The lithographic patterning system of claim 17, wherein the mask layer of the prism is disposed over the layer, the resist layer, the substrate, and the stage.

19. The lithographic patterning system of claim 18, wherein the mask layer of the prism patterns the resist layer without an isolated mask layer.

20. The lithographic patterning system of claim 17, wherein the layer includes a low viscosity material.

21. The lithographic patterning system of claim 20, wherein the layer is water.

* * * * *